(12) United States Patent
Furuta et al.

(10) Patent No.: US 6,271,673 B1
(45) Date of Patent: Aug. 7, 2001

(54) PROBE FOR MEASURING SIGNALS (75) Inventors: Masaji Furuta; Koichi Yanagawa, both of Hyogo (JP)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/277,798

(22) Filed: Mar. 27, 1999

(30) Foreign Application Priority Data

Mar. 31, 1998 (JP) .................................................. 10-085779

(51) Int. Cl.[7] ....................................................... G01R 1/04
(52) U.S. Cl. ..................... 324/754; 324/158.1; 324/72.5; 439/482
(58) Field of Search ................................. 324/158.1, 754, 324/72.5, 142; 439/482

(56) References Cited

U.S. PATENT DOCUMENTS

| | | | | |
|---|---|---|---|---|
| 2,323,925 | * | 7/1943 | Markwardt | 324/158.1 |
| 4,721,903 | * | 1/1988 | Harsch et al. | 324/72.5 |
| 4,801,434 | * | 1/1989 | Kido et al. | 422/100 |
| 5,546,663 | * | 8/1996 | Warwicker | 33/27.02 |
| 5,555,630 | * | 9/1996 | De Souza | 33/27.02 |

FOREIGN PATENT DOCUMENTS 06048211   3/1994   (JP) .

OTHER PUBLICATIONS (1) Impedance Probe Kit for HP 4194A.
(2) HP 41800A Active Probe.

* cited by examiner

*Primary Examiner*—Safet Metjahic
*Assistant Examiner*—Jimmy Nguyen (57) ABSTRACT

A probe for measuring signals with a narrow contact pitch comprises an end section having a main tip member and a sub-tip member, each of which passes through one of two holes in a housing. The sub-tip member is electrically connected to the housing and the main-tip member is insulated from the housing by an insulation member. The sub-tip member is pivotally connected to the housing. The subtip member is asymmetric with respect to the pivot and therefore, its sharpened end can trace a circular orbit when the sub-tip member turns on its pivot. The distance between the two end sections of these tip members (that is, the contact pitch) can be set to a desired length by positioning sub-tip sharpened end section to any point on this orbit.

18 Claims, 5 Drawing Sheets

PROBE FOR MEASURING SIGNALS

FIELD OF THE INVENTION

The present invention pertains to a probe that is connected to electronic measurement instruments for measuring the signals from each lead of an electronic circuit package and other electronic components mounted on a substrate. More particularly it pertains to a probe for measuring the signals of high-density mounted electronic circuit packages with narrow pitch between their leads with one hand.

BACKGROUND OF THE INVENTION

Figure 1:
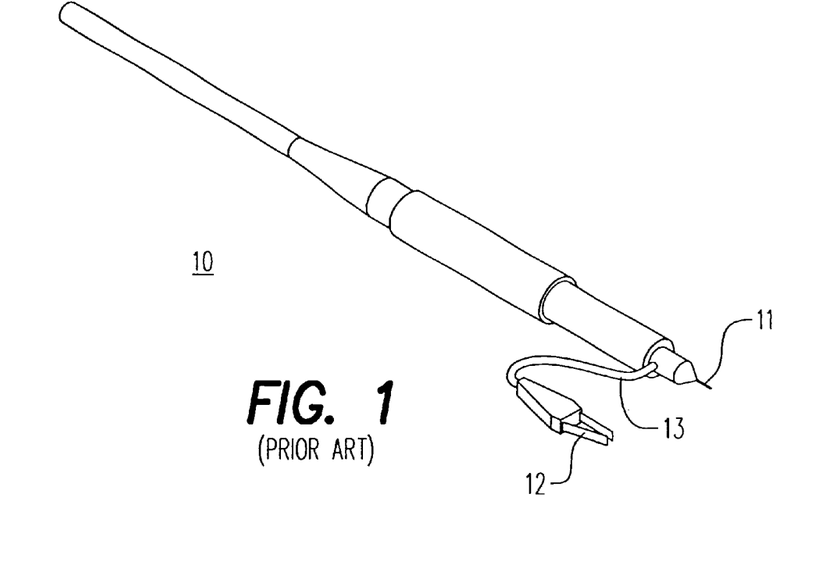
FIG. 1 is a diagram of a prior art probe for measuring signals.

FIG. 1 is a conventional one hand held probe for measuring the signals on each lead of electronic circuit packages and other electronic components mounted on a substrate (these are collectively referred to as "DUT" below). Probe 10 has alligator clip 12, which is coupled to a portion adjacent to a tip section 11 of the probe via cable 13. By means of this type of probe, one of the leads (for instance, the ground terminal) is clasped and anchored by alligator clip 12 and tip section 11 is brought into contact with another lead. This type of probe is advantageous in that it is possible to keep one lead electrically connected to alligator clip 12, and therefore the user can quickly introduce tip section 11 to several leads in succession, using one hand.

However, it is often impossible to use such a probe to clasp narrow-pitch leads of an electronic circuit package as well as the leads of electronic components mounted on a substrate at high density, therefor such probes can not perform their function in this case.

Figure 2:
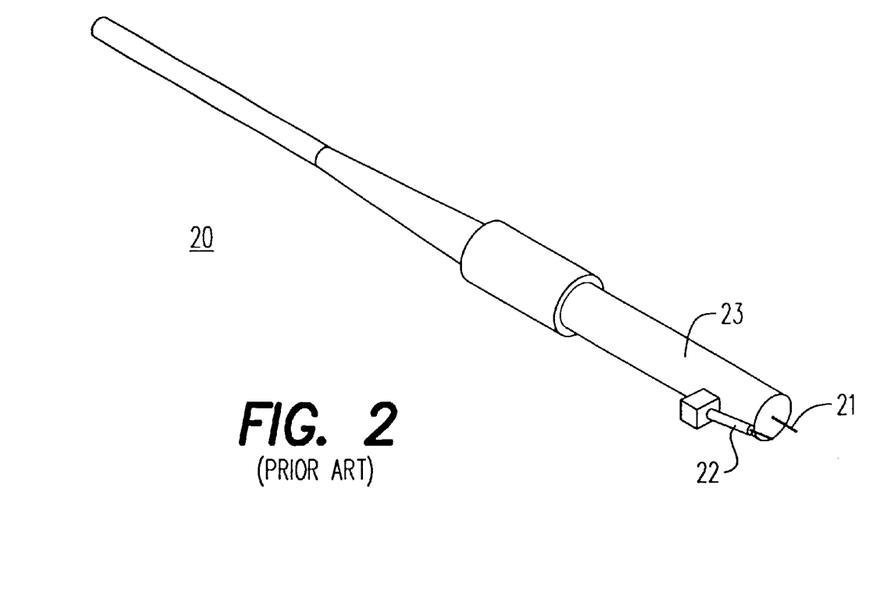
FIG. 2 is a diagram of a prior art probe for measuring signals.

FIG. 2 shows another conventional probe 20. This probe 20 has sub-tip section 22 next to main tip section 21. This sub-tip section 22 is attached to the side near the main tip section 21 pivotally on its pivot so that it moves within a plane that includes the axis of the main tip section and the axis of the sub-tip section. Thus, the pointed end of this sub-tip section 22 can move up to and away from the pointed tip of main tip section 21. This structure is suitable for probing leads with a relatively narrow pitch using one hand.

When a probe is used to measure RF signals, coaxial structure must be typically maintained in its axial position that is as close to the measuring point as possible. Therefore, the length of exposed main tip section 21 must be as short as possible in order to maintain this coaxial structure. With a design of short main chip section 21, however, when trying to move sub-tip section 22 closer to main tip section 21, sub-chip section 22 bumps against outer surface 23 of the probe before it gets close to main tip section 21, resulting in that they cannot get close proximity each other. On the other hand, if the main tip section 21 is made longer to prevent the sub-tip section 22 from bumping against the outside surface 23, in turn, a problem with the coaxial structure will occur. That is, this type of probe is designed taking into consideration whether it is more important to maintain a coaxial structure or to have a pitch that makes narrower pitch probing possible, and the designer must inevitably choose between these two alternatives. The pitch which enables this type of probe to be used for probing is limited to approximately 5 mm, therefor this type of probe is not suitable for probing leads that have a narrower pitch than that.

Furthermore, the position of the sub-tip section often changes slightly as the force applied by the user changes during probing, because the end section of the type of probe shown in FIG. 2 is not rigid. Consequently, it is often the case that the measurements are unstable and do not have good reproducibility when this probe is used for measuring microcurrent and high-frequency signals.

Consequently, the purpose of the present invention is to present a one hand held probe for probing electronic circuit packages and various electronic components with a pitch that is narrower than the minimum pitch of leads with which the probes of prior art can cover.

Another purpose of the present invention is to present a probe for measuring signals that is flexible so that it can be adjusted by the user to any pitch as needed.

Yet another purpose of the present invention is to present a probe for measuring signals with high measurement stability and reproducibility.

SUMMARY OF THE INVENTION

The probe for measuring signals of the present invention comprises a end section that having a housing with a first and a second portions defining holes, a first tip member penetrating the first hole of the housing, and a second tip member, which is placed pivotally in the second hole of the housing so that it can turn on its pivot and is electrically insulated from the first tip member, where one end of the second tip member has a shape that is asymmetric to its pivot. The distance between the pointed end of the first tip member and the pointed end of the second tip member is determined by moving the second tip member to a desired position.

The housing of the probe is preferably electrically conductive, where an insulation member is wrapped around the first tip member so that the first tip member is electrically insulated from the housing, and the second tip member is electrically connected to the housing.

Furthermore, The probe for signal measurement according to the present invention preferably further comprises a fixation means for fixating the second tip member at a desired rotational position. For example, the fixation means preferably comprises at least one threaded third hole piercing the housing from its outer surface of the housing to the second hole, and at least one fastening knob with a thread engaging the third hole which pushes the second tip member in the second hole when rotated in one direction and moves away from the second tip member when rotated in the other direction.

Further, the end section is preferably detachable from the body of the probe. By using a coaxial connector such as an SMA connector as this detachment means, calibration is achieved using a conventional calibration standard.

DETAILED DESCRIPTION OF THE INVENTION

Embodiments of the invention considered to be optimal at the present time will be described referring to the figures. The structural elements with the same reference number in the figures have the same function throughout the text.

Figure 3:
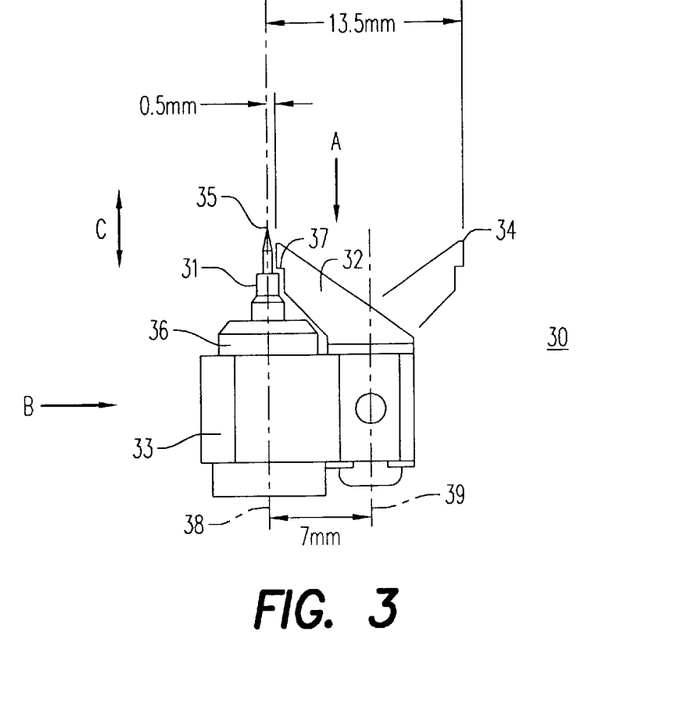
FIG. 3 is a side view showing an embodiment of the end section of the probe of the present invention.
Figure 4:
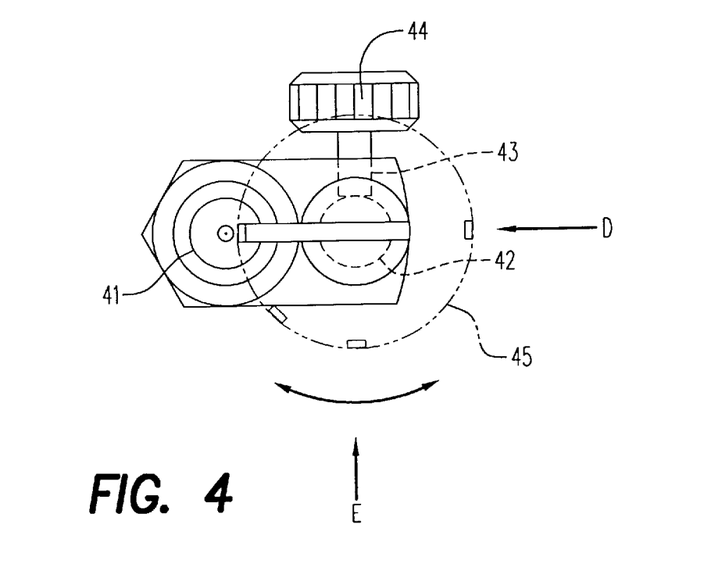
FIG. 4 is a top view of the end section of the probe of the present invention, as seen from the direction of arrow A in FIG. 3.
Figure 5:
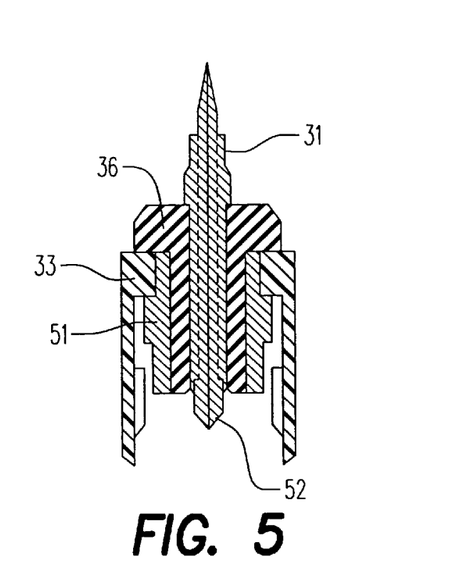
FIG. 5 is a cross-sectional of the end section of the probe of the present invention, as seen from the direction of arrow B in FIG. 3.
Figure 9:
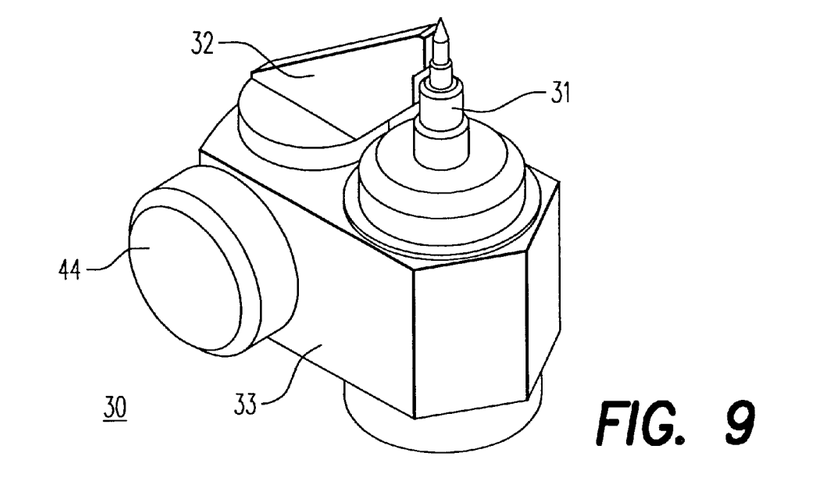
FIG. 9 is a perspective view showing an embodiment of the end section of the probe of the present invention.

FIG. 3 is a side view of a first embodiment of an end section 30 of the probe of the present invention. FIG. 9 is a perspective view. FIG. 4 is a top view as seen from the direction of arrow A in FIG. 3. FIG. 5 is a cross-sectional view as seen from the direction of arrow B cutting by a plane including axis 38 perpendicular to the figure plane of FIG. 3. As shown in FIG. 3, the end section of the probe includes main tip member 31, sub-tip member 32, and housing 33. As shown in FIG. 4, there are two portions defining cylindrical holes 41 and 42 which pass through the housing 33. The main tip member 31 is inserted into hole 41 and the sub-tip member 32 is inserted into hole 42.

Sub-tip member 32 is electrically conductive and its sharpened end section 34 is sharpened so that it can easily make contact with the leads of the object to be measured. Moreover, the part of sub-tip member 32 that passes through housing 33 has a cylindrical shape that matches hole 42, therefore it can turn round 360 degrees, as shown in FIG. 4. This sharpened end section 34 can be positioned at any point on the turning trace (45), as shown in FIG. 4.

A spring-loaded pin, such as a pogo pin, etc., may be used for sharpened end section 35 of the main tip member 31. By using the spring-loaded pin, the sharpened end section 35 becomes telescopic in the direction of the arrow C in FIG. 3 and therefore, can be reliably brought into contact with the leads of a DUT during probing. Further, part 37 of sub-tip member 32 next to the main tip member 31 may also be chamfered to be aligned with the shape of the sharpened end section of the main tip member when it is closest to the main tip member, as shown in FIG. 3. Thus, the distance between the sharpened end section 34 of the sub-tip member and sharpened end section 35 of the main tip member can be reduced to almost the tolerance limit while the rigidity of the sub-tip member is maintained at its maximum limit. Chamfering may be done according to the shape of the main tip member. For example, as shown in FIG. 3, when the size of tip portion 30 is designed so that the distance between center axis 38 of the main tip member 31 and the pivoting axis 39 of the sus-tip member 32 is 7 mm, the shape of the sub-tip member can be designed so that the distance between the sharpened end section 35 of main tip member 31 and the sharpened end section 34 of the sub-tip member 32 can be set to the maximum of 13.5 mm and to the minimum of 0.5 mm.

Furthermore, by making housing 33 from an electrical conductor and connecting it to the guard line of the probe body, a probe can be achieved where a coaxial structure is maintained maximally close to the sharpened end of the main tip member, that is, a probing point. In this case, the main tip member 31 must be wrapped with insulation member 36 and electrically insulated from housing 33, as shown in FIG. 5. The shape of the part of sub-tip member 32 that is not encapsulated by housing 33 may be a plate-like shape with a predetermined thickness to make the impedance of this part lower than that of a pin shape one. This type of construction is suitable for measurement of high-frequency signals.

Figure 6:
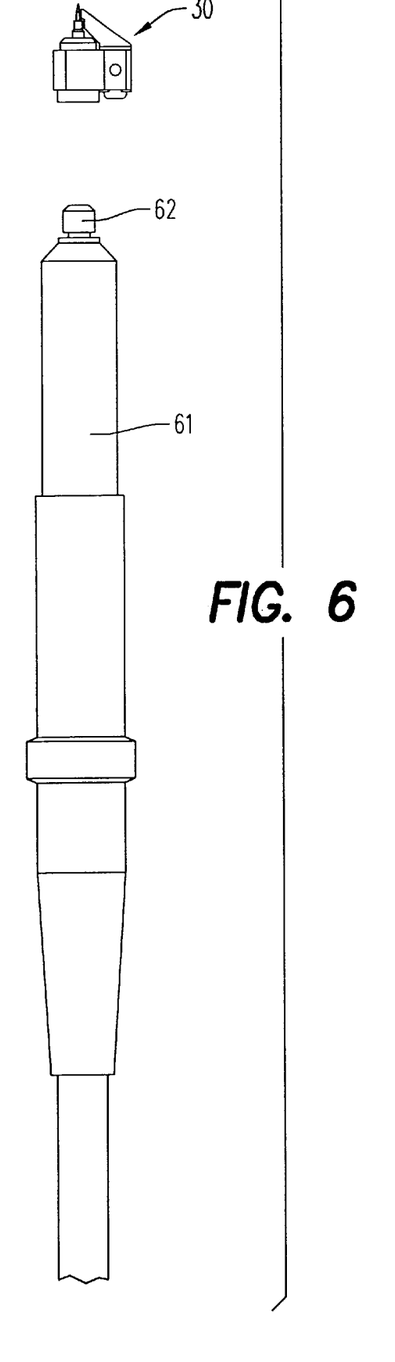
FIG. 6 is a diagram for explaining an embodiment of the probe of the present invention.

A variety of connections between end section 30 and the probe body may be considered. The end section 30 may be assembled as one unit with the probe body. The end section may be also detachable from user grip 61, as shown in FIG. 6.

The end section 30 and the user grip 61 are preferably connected detachably employing a connector structure in order to make the end section 30 detachable. A coaxial connector that meets IEC standard 169-23, such as an SMA connector, etc., may be employed as this connector structure, so that the probe can be used for measuring RF signals. It is also possible to perform the open/short/load calibrations using conventional calibration standards when the coaxial connectors are employed for the connection. Further, since the end section 30 can be easily detached from the probe body, it can be quickly replaced when the end section 30 has been damaged, etc.

The cross section shown in FIG. 5 is an embodiment of the aforementioned connector structure employed for the detachable connector between the end section 30 and the probe body. In short, the housing 33, conductive cylinder 51, insulation member 36, and one end 52 of tip member 31 form a typically male SMA connector. The end of user grip 61 forms a typically female SMA connector. An electrical connection is formed by engaging these connectors together. The details of male SMA connectors and method for attaching the female SMA connector to the user grip 61 are well-known to those skilled in the art, therefore will not be discussed here.

In order to improve measurement stability and reproducibility, the end section 30 may further comprise a fastening knob 44 to fasten sub-tip member 32 to surface of the hole 42, as shown in FIG. 4. In a preferred embodiment of the present invention, the knob 44, which is threaded to engage with threaded hole 43, is screwed into the hole 43 that passes from the outside surface of housing 33 to hole 42. Thus, when the tip member 32 has been turned to be at desired rotational position, the tip member 32 is pressed onto surface of the hole 42 in the forward direction of the knob 44 by screwing the knob 44 into the threaded hole 43. This arrangement suppresses the fluctuation of the status of electrical contact between the tip member 32 and hole 42, resulting in stable measurement values, since the tip member 32 is pressed toward the direction of the advance of the fastening knob 44 in the hole 42 and fixated by screwing the fastening knob 44 into the threaded hole 43 after rotating the tip member 32 and positioning it to a desired position. When repeated probing at a certain constant pitch is performed, the above described open/short/load calibration with the sub tip member 32 fixated at a desired position allows measurement of higher repeatability.

The fastening knob 44 is inserted into the threaded hole 43 from one direction in FIG. 4, but the number of the knobs is not limited to one. For instance, the fastening knob may be inserted from the directions shown by arrow D and/or arrow E in FIG. 4, and any other direction as long as required rigidity is achieved. Furthermore, a wedge member made from a flexible material may be used to be inserted into a gap between the hole 42 and the sub-tip member 32 used in place of the fastening knob 44.

Figure 7:
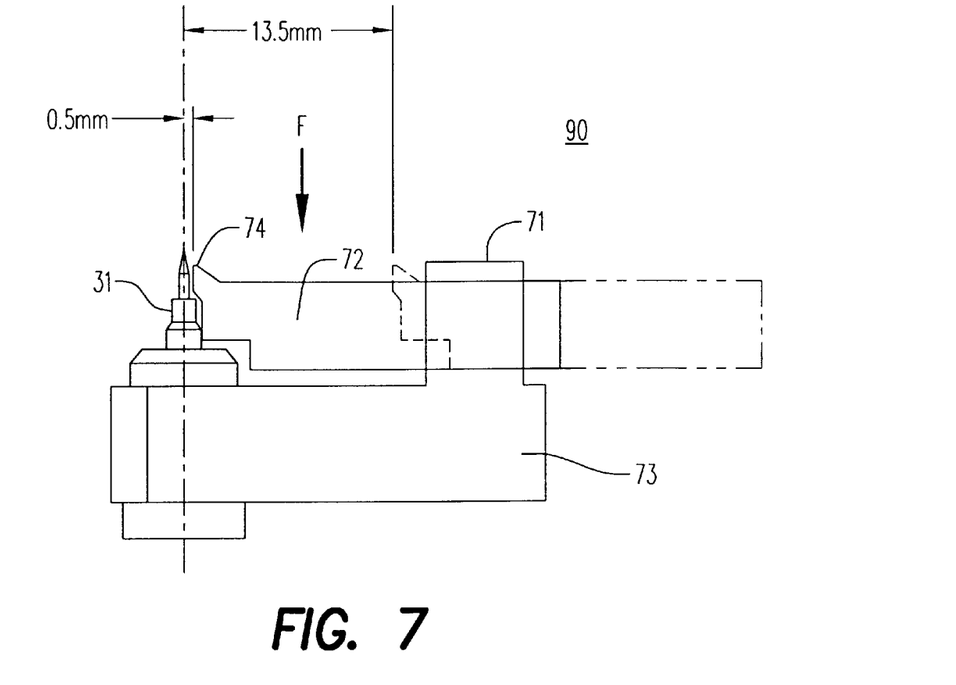
FIG. 7 is a side view of another embodiment of the end section of the probe of the present invention.
Figure 10:
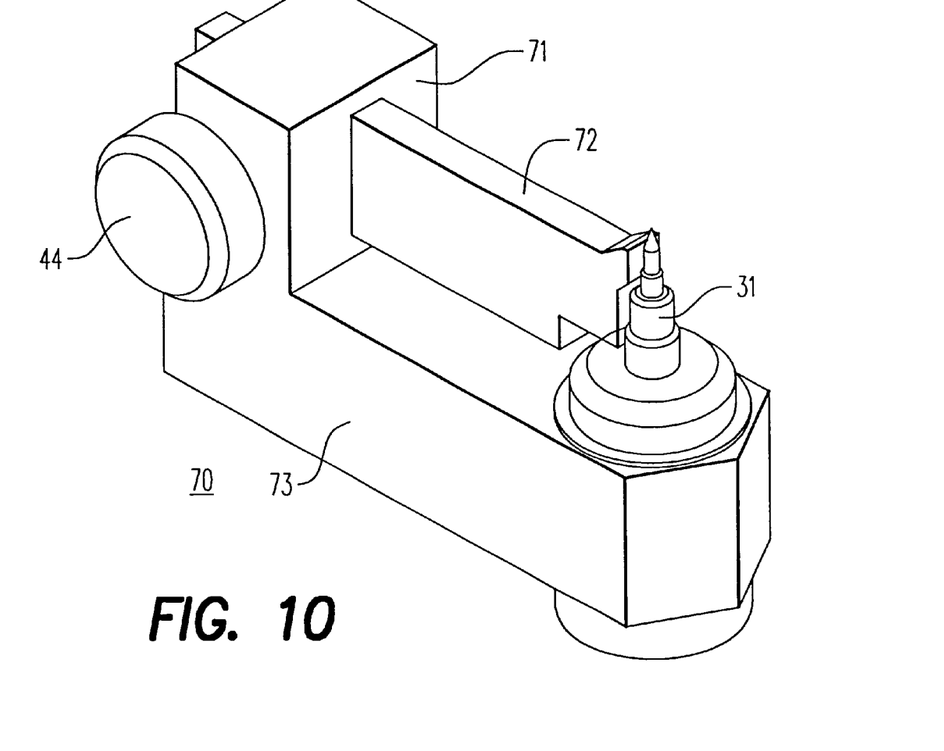
FIG. 10 is a perspective view of another embodiment of the end section of the probe of the present invention.

Next, the present invention will be described with reference to a second embodiment. FIG. 7 is a side view of a second embodiment of an end section 70 of probe of the present invention, FIG. 10 is its perspective view, and FIG.

Figure 8:
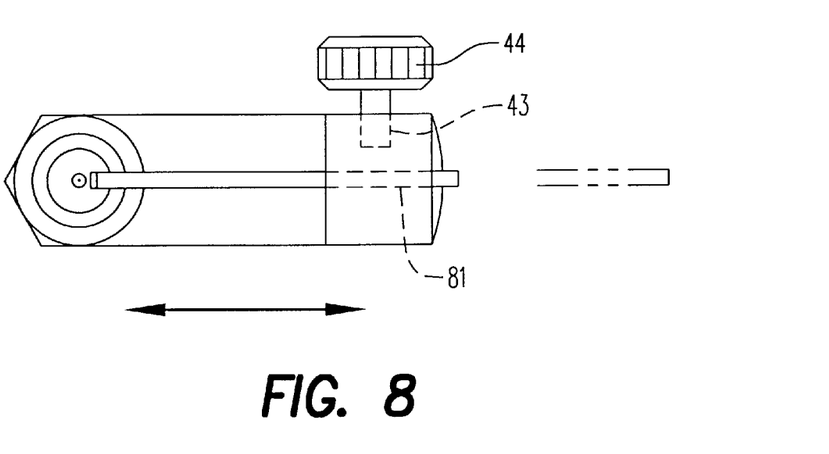
FIG. 8 is a projection of the end section of a probe of the present invention as seen from the direction of arrow F in FIG. 7.

8 is a projection as seen from the direction of arrow F in FIG. 7. As shown in FIG. 7, housing 73 has a projection 71. The projection 71 has a hole 81 by which a sub-tip member 72 is supported slidably thereon. As is clear from FIG. 7, it is possible to set the pitch as needed by sliding the sub-tip member 72 to the right or left.

As well as in the first embodiment, threaded hole 43 passes from a side of the projection 71 to hole 81. A fastening knob 44 which is threaded to engage with the hole 43 is screwed into the hole 43 so that the sub-tip member 72 is pressed onto the inside of the hole 43 and fixed thereon. The same effect as in the first embodiment is obtained by this arrangement, therefore the measurement stability and reproducibility are improved. The advantage of the structure of this embodiment is that since the contact surface between the sub-tip member 72 and the hole 81 is flat, it is larger than the curved surface in the first embodiment. Therefore, the positioning stability of the sub-tip member is improved. Consequently, the end section 70 of this embodiment is more functional as long as there is no problem with its large size.

The same structure as in the first embodiment may be used for main tip member 31 in FIG. 7. In addition, the same chamfering as in the first embodiment is preferably performed on the part of sub-tip member 72 that is next to the main tip member 31. It goes without saying that the coaxial structure and method for connecting of the probe body and the end section may be the same as in the first embodiment.

However, in order to make the range of the possible pitch setting of the second embodiment to be the same as the form of the above mentioned first embodiment, it is needed to design the thickness and the width of sub-tip member 72 of the second embodiment to be slightly larger than those of sub-tip member 32 of the first embodiment. This is because the amount of the distortion at sharpened end 74 of the sub-tip member 72 when the pitch is set to be the shortest is larger than that of the first embodiment due to the nature of a plate member that its distortion is generally proportional to the cube of the distance from its supporting point, and the amount of the distance between tip 74 and the fulcrum (projection 71) is, different from the first embodiment, varies according to the pitch setting. As is understood from this, when maximum stiffness and stability are required as well as small dimensions that allow easy probing, the end section 30 of the first embodiment may be considered to have the optimal shape.

The present invention has been explained in detail with preferred embodiments, but it is clear that the embodiments can be changed and modified as long as they do not deviate from the spirit of the present invention. Consequently, the scope of the present invention is limited only by the claims hereof.

What is claimed is:

1. A probe for measuring signals comprising:
    a coaxial probe body for conveying signals between a device under test and an electronic measuring unit; and
    an end section, electrically and coaxially coupled to said probe body, said end section comprising:
        a housing having portions defining a first hole and a second hole;
        a first tip member inserted in said first hole, said first tip member and electrically insulated from said housing for conveying a first signal between said device under test and said measuring instrument; and
        a second tip member inserted in the second hole and electrically coupled to said housing, said second tip member having a first end rotationally held therein and a second end having an asymmetric shape with respect to its rotation, said second tip member electrically insulated from the first tip member and for conveying a second signal between said device under test and said measuring instrument;
        wherein the distance between a sharpened end of the first tip member and said second end of the second tip member is determined by rotating said second tip member to a specific position.

2. The probe for measuring signals as recited in claim 1, wherein the housing is electrically conductive, the second tip member is electrically coupled to the housing, and further comprising:
    an insulation member wrapped around the first tip member so that said first tip member is electrically insulated from the housing.

3. The probe for measuring signals as recited in claim 1, further comprising:
    fixation means for fixating the second tip member to a specific rotational position.

4. The probe for measuring signals as recited in claim 3, wherein the fixation means comprises:
    at least one portion defining a threaded third hole that passes from the outside surface of the housing to the second hole; and
    at least one fastening knob threaded to engage with the third hole so that the knob presses the second tip member in the second hole when it is turned in one direction and moves away from the second tip member when it is turned in another direction.

5. The probe for measuring signals as recited in claim 1, wherein the probe includes a body portion and the end section is pluggably detachable from the body portion.

6. The probe for measuring signals as recited in claim 4, wherein the probe includes a body portion and the end section is pluggably detachable from the body portion.

7. A probe for measuring signals comprising:
    a coaxial probe body for conveying signals between a device under test and an electronic measuring unit; and
    an end section, electrically and coaxially coupled to said probe body, said end section comprising:
        a housing having portions defining a first hole and a second hole;
        a first tip member inserted in said first hole, said first tip member electrically insulated from said housing for conveying a first signal between said device under test and said measuring instrument; and
        a second tip member inserted in the second hole and electrically coupled to said housing, said second tip member having a first end rotationally held therein and a second end having an asymmetric shape with respect to its rotation, said second tip member electrically insulated from the first tip member and for conveying a second signal between said device under test and said measuring instrument;
        an insulation member wrapped around the first tip member so that said first tip member is electrically insulated from the housing; and
        fixation means for fixating the second tip member to a specific rotational position, and
        wherein the distance between a sharpened end of the first tip member and said second end of the second tip member is determined by rotating said second tip member to a specific position.

8. The probe for measuring signals as recited in claim 7, wherein the fixation means comprises:

at least one portion defining threaded third hole that passes from the outside surface of the housing to the second hole; and at least one fastening knob threaded to engage with the third hole so that the knob presses the second tip member in the second hole when it is turned in one direction and moves away from the second tip member when it is turned in another direction.

9. The probe for measuring signals as recited in claim 7, wherein the probe includes a body portion and the end section is pluggably detachable from the body portion.

10. The probe for measuring signals as recited in claim 8, wherein the probe includes a body portion and the end section is pluggably detachable from the body portion.

11. A coaxial probe for measuring signals from a device under test, which includes an end section, said end section comprising:

a housing having portions defining a first hole and a second hole, wherein said holes are perpendicular to each other;

a first tip member inserted in said first hole, said first tip member electrically insulated from said housing for conveying a first signal from said device under test; and a second tip member inserted in the second hole and electrically coupled to said housing, said second tip member having a first end and a second end, said first end slidingly held in said second hole and said second tip member electrically insulated from the first tip member and for conveying a second signal from said device under test; and wherein the distance between an end of said first tip member and said second end of said second tip member is determined by sliding said second tip member to a specific position relative to said first tip member.

12. The probe for measuring signals as recited in claim 11, wherein the housing is electrically conductive, the second tip member is electrically coupled to the housing, and further comprising:

an insulation member wrapped around the first tip member so that said first tip member is electrically insulated from the housing.

13. The probe for measuring signals as recited in claim 11, further comprising:

fixation means for fixating the second tip member at a desired position relative to said first tip member.

14. The probe for measuring signals as recited in claim 13, wherein the fixation means comprises:

at least one portion defining a threaded third hole that passes from the outside surface of the housing to the second hole; and at least one fastening knob threaded to engage with the third hole so that the knob presses the second tip member in the second hole when it is turned in one direction and moves away from the second tip member when it is turned in another direction.

15. The probe for measuring signals as recited in claim 11, wherein the probe includes a body portion and the end section is pluggably detachable from the body portion.

16. A probe for measuring signals comprising:

a coaxial probe body for conveying signals between a device under test and an electronic measuring unit; and an end section, electrically and coaxially coupled to said probe body, said end section comprising:

a housing having portions defining a first hole and a second hole;

a first tip member inserted in said first hole, said first tip member extending substantially linearly and electrically insulated from said housing for conveying a first signal between said device under test and said measuring instrument; and a second tip member inserted in the second hole and electrically coupled to said housing, said second tip member having a first end rotationally held therein and a second end having an asymmetric shape with respect to its rotation, said second tip member electrically insulated from the first tip member and for conveying a second signal between said device under test and said measuring instrument;

wherein the distance between a sharpened end of the first tip member and said second end of the second tip member is determined by rotating said second tip member to a specific position on a plane extending substantially perpendicular to said first tip member, and said coaxial probe body and said end section are arranged so that said first signal and said second signal are separately passed to said coaxial probe body for forming said signals conveyed between said device under test and said measuring instrument.

17. A probe for measuring signals comprising:

a coaxial probe body for conveying signals between a device under test and an electronic measuring unit; and an end section, electrically and coaxially coupled to said probe body, said end section comprising:

a housing having portions defining a first hole and a second hole;

a first tip member inserted in said first hole, said first tip member extending substantially linearly and electrically insulated from said housing for conveying a first signal between said device under test and said measuring instrument; and a second tip member inserted in the second hole and electrically coupled to said housing, said second tip member having a first end rotationally held therein and a second end having an asymmetric shape with respect to its rotation, said second tip member electrically insulated from the first tip member and for conveying a second signal between said device under test and said measuring instrument;

an insulation member wrapped around the first tip member so that said first tip member is electrically insulated from the housing; and fixation means for fixating the second tip member to a specific rotational position, and wherein the distance between a sharpened end of the first tip member and said second end of the second tip member is determined by rotating said second tip member to a specific position on a plane extending substantially perpendicular to said first tip member, and said coaxial probe body and said end section are arranged so that said first signal and said second signal are separately passed to said coaxial probe body for forming said signals conveyed between said device under test and said measuring instrument.

18. A coaxial probe for measuring signals from a device under test, which includes an end section, said end section comprising:

a housing having portions defining a first hole and a second hole, wherein said holes are perpendicular to each other;

a first tip member inserted in said first hole, said first tip member extending substantially linearly and electrically insulated from said housing for conveying a first signal from said device under test; and a second tip member inserted in the second hole and electrically coupled to said housing, said second tip member having a first end and a second end, said first end slidingly held in said second hole and said second tip member electrically insulated from the first tip member and for conveying a second signal from said device under test; and wherein the distance between an end of said first tip member and said second end of said second tip member is determined by sliding said second tip member to a specific position relative to said first tip member on a plane extending substantially perpendicular to said first tip member, and said coaxial probe and said end section are arranged so that said first signal and said second signal are separately passed to said coaxial probe for forming said measured signals from said device under test.

* * * * *